US008844148B2

(12) United States Patent
 Ohta

(10) Patent No.: US 8,844,148 B2
(45) Date of Patent: Sep. 30, 2014

(54) DIRECTION DETERMINING METHOD AND APPARATUS USING A TRIAXIAL ELECTRONIC COMPASS

(75) Inventor: Makoto Ohta, Tokyo (JP)

(73) Assignee: Pentax Ricoh Imaging Company, Ltd., Tokyo (JP)

( * ) Notice: Subject to any disclaimer, the term of this patent is extended or adjusted under 35 U.S.C. 154(b) by 299 days.

(21) Appl. No.: 13/493,127

(22) Filed: Jun. 11, 2012

(65) Prior Publication Data

US 2012/0317825 A1 Dec. 20, 2012

(30) Foreign Application Priority Data

Jun. 14, 2011 (JP) ................................ 2011-132364

(51) Int. Cl.
 *G01C 17/38* (2006.01)
 *G01C 17/28* (2006.01)
 *G01R 33/02* (2006.01)
 *G03B 17/18* (2006.01)

(52) U.S. Cl.
 CPC ............ *G01C 17/28* (2013.01); *G01R 33/0206* (2013.01); *G03B 17/18* (2013.01)
 USPC .............................................. 33/334; 33/356

(58) Field of Classification Search
 USPC ................... 33/355 R, 333, 334, 356
 See application file for complete search history.

(56) References Cited

U.S. PATENT DOCUMENTS

| 6,009,629 | A * | 1/2000 | Gnepf et al. | 33/357 |
|---|---|---|---|---|
| 6,836,971 | B1 * | 1/2005 | Wan | 33/356 |
| 7,057,645 | B1 * | 6/2006 | Hara et al. | 348/208.6 |
| 7,086,164 | B2 * | 8/2006 | Satoh et al. | 33/316 |
| 7,119,533 | B2 * | 10/2006 | Tamura et al. | 324/202 |
| 7,278,219 | B2 * | 10/2007 | Honkura et al. | 33/356 |
| 7,377,046 | B2 * | 5/2008 | Yamada | 33/356 |
| 7,428,780 | B2 * | 9/2008 | Lemp et al. | 33/268 |
| 8,577,636 | B2 * | 11/2013 | Hirobe et al. | 702/92 |
| 8,698,503 | B2 * | 4/2014 | Honkura et al. | 324/345 |
| 2002/0100178 | A1 * | 8/2002 | Smith et al. | 33/356 |

(Continued)

FOREIGN PATENT DOCUMENTS

| JP | 6-130446 | 5/1994 |
|---|---|---|
| JP | 07-043162 | 2/1995 |

(Continued)

OTHER PUBLICATIONS

P.C.T. Office action, dated Jun. 7, 2011 along with an english translation thereof.

(Continued)

*Primary Examiner* — Christopher Fulton
(74) *Attorney, Agent, or Firm* — Greenblum & Bernstein, P.L.C.

(57) ABSTRACT

A method of determining a direction of a triaxial electronic compass oriented in a specific direction by using the triaxial electronic compass and an inclination sensor, the method includes obtaining an elevation angle of the specific direction from the inclination sensor to switch a selection of two output values from the three output values to another selection of two output values therefrom; determining a geomagnetic aspect from the two output values; obtaining a rotational angle about an axis extending in the specific direction from the inclination sensor; calculating a deviation angle of the direction of the triaxial electronic compass which is caused by the selection switching, in accordance with the elevation angle, the geomagnetic aspect and the rotational angle; and correcting the direction of the triaxial electronic compass in accordance with the deviation angle.

10 Claims, 7 Drawing Sheets

(56) References Cited

U.S. PATENT DOCUMENTS

| | | |
|---|---|---|
| 2007/0000140 A1 | 1/2007 | Sato |
| 2010/0103251 A1 | 4/2010 | Numako |
| 2011/0131825 A1* | 6/2011 | Mayor et al. .................... 33/356 |
| 2013/0000136 A1* | 1/2013 | Vigna et al. ................. 33/355 R |

FOREIGN PATENT DOCUMENTS

| | | |
|---|---|---|
| JP | 2000-224470 | 8/2000 |
| JP | 2001-013420 | 1/2001 |
| JP | 2003-259184 | 9/2003 |
| JP | 2004-201056 | 7/2004 |
| JP | 2007-040982 | 2/2007 |
| JP | 2007-89087 | 4/2007 |
| JP | 2008-289052 | 11/2008 |
| JP | 2010-122672 | 6/2010 |

OTHER PUBLICATIONS

P.C.T. Office action, dated Jul. 24, 2012 along with an english translation thereof.

* cited by examiner

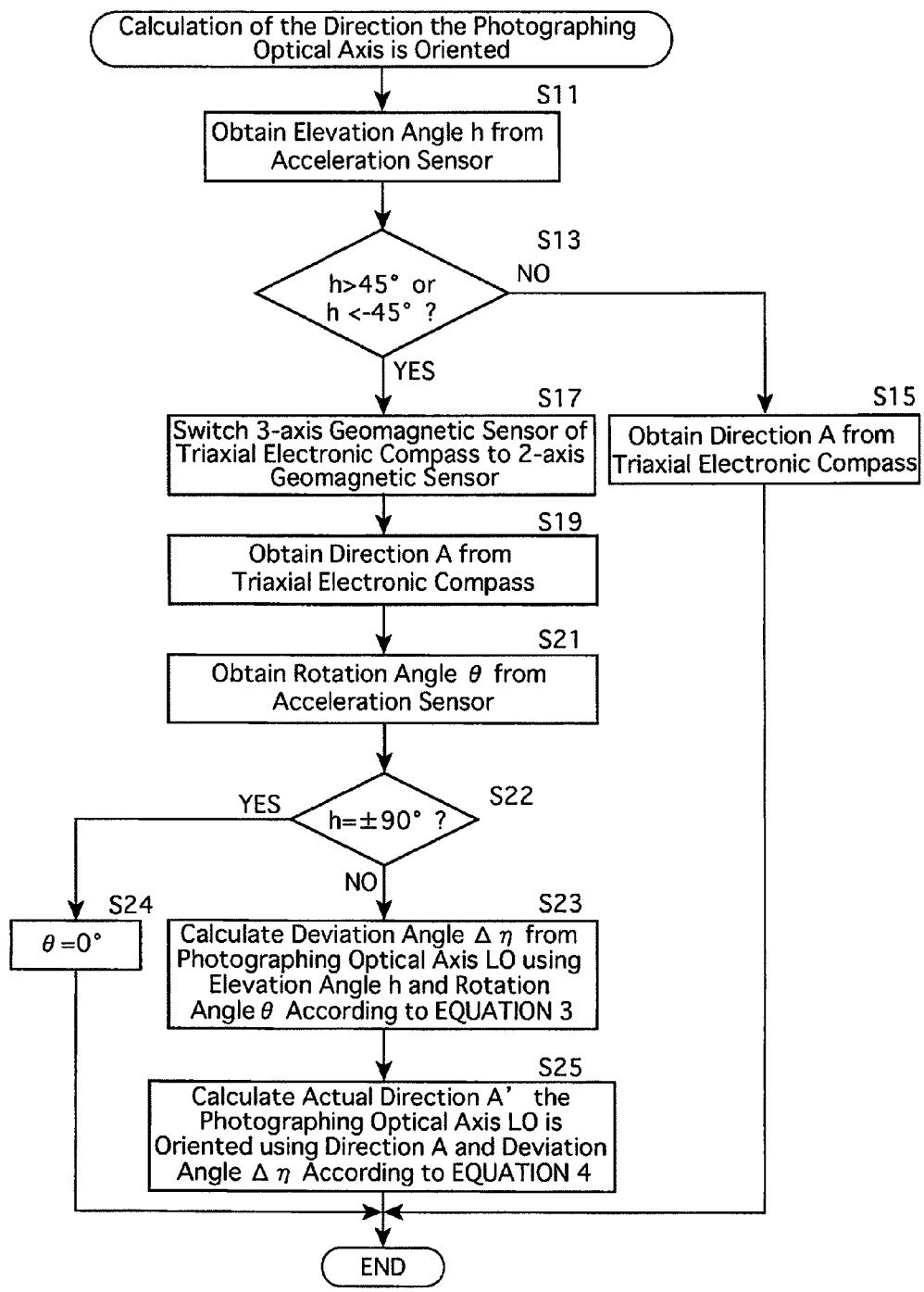

DIRECTION DETERMINING METHOD AND APPARATUS USING A TRIAXIAL ELECTRONIC COMPASS

BACKGROUND OF THE INVENTION

1. Field of the Invention

The present invention relates to a direction determining method using a triaxial electronic compass which makes it possible to precisely determine the direction (orientation) of a photographic apparatus that is oriented in a specific direction (e.g., the direction along which a photographing optical axis of a photographing optical system incorporated in the photographic apparatus is pointing) at all times regardless of the position (posture) of the photographic apparatus (digital camera). The present invention also relates to a direction determining apparatus to which this direction determining method is applied.

2. Description of the Related Art

Apparatuses such as binoculars which are equipped with an electronic compass are known in the art. For instance, Japanese Unexamined Patent Publication No. 2001-13420 discloses a pair of binoculars which can display an image of an electronic compass in the field of view, and Japanese Unexamined Patent Publication No. H07-43162 discloses a pair of binoculars which displays the orientation (direction) of a target observation object in the field of view. However, in the above-mentioned Japanese Unexamined Patent Publication Nos. 2001-13420 and H07-43162, in a state where the axis of the objective optical system or the line of sight largely tilts relative to the horizontal direction, e.g., where one looks up the sky or the zenith, the orientation cannot be detected with precision.

In addition, triaxial electronic compasses equipped with a 3-axis geomagnetic sensor (terrestrial magnetic sensor), the three sensor axes of which are orthogonal to one another, have been developed in recent years. An electronic device such as a cellular phone which incorporates this type of triaxial electronic compass detects geomagnetism (the magnetism of the earth) through use of the 3-axis geomagnetic sensor and also detects the direction of gravity (the inclination of the electronic device in the forward/rearward direction) to determine the direction at which the user of the cellular phone is facing (Japanese Unexamined Patent Publication No. 2007-40982).

In addition, methods of automatically tracking and photographing celestial objects in which long exposure astrophotography is carried out with a fixed photographic apparatus while the image sensor (image pickup device) of the photographic apparatus is being driven (moved) to photograph a celestial object(s), which moves relative to a photographic apparatus due to the earth's rotation (diurnal motion) has been proposed (Japanese Unexamined Patent Publication Nos. 2008-289052 and 2010-122672).

In such a celestial-object auto tracking photography, to perform a celestial-object auto-tracking operation with higher precision, it is required to precisely determine the photographing direction at which the photographing optical system of the photographic apparatus is oriented (facing).

However, if one attempts to determine the photographing direction at which the photographing optical system of the photographic apparatus is oriented with the photographic apparatus aimed at the zenith (or pointed in a direction close to the zenith) while applying a conventional triaxial electronic compass, such as taught in the above-mentioned Japanese Unexamined Patent Publication No. 2007-40982, to celestial-object auto tracking photography like that disclosed in the above-mentioned Japanese Unexamined Patent Publication Nos. 2008-289052 and 2010-122672, there are times when a totally different direction is improperly determined as the direction at which the photographing optical system of the photographic apparatus is oriented.

SUMMARY OF THE INVENTION

The present invention has been devised in view of the above described problems of the prior art and provides a direction determining (finding) method using a triaxial electronic compass which makes it possible to precisely determine the direction (orientation) of a photographic apparatus equipped with the triaxial electronic compass that is oriented in a specific direction (e.g., the direction along which a photographing optical axis of a photographing optical system incorporated in the photographic apparatus is pointing) at all times regardless of the positions (postures) of the triaxial electronic compass and the photographic apparatus that is equipped with the triaxial electronic compass. The present invention also provides a direction determining (finding) apparatus to which this direction determining method is applied.

According to an aspect of the present invention, a method of determining a direction of a triaxial electronic compass that is oriented in a specific direction, is provided, by using the triaxial electronic compass and an inclination sensor, wherein the triaxial electronic compass includes a mutually-orthogonal 3-axis geomagnetic sensor and selectively uses two output values from among three output values of the mutually-orthogonal 3-axis geomagnetic sensor, and wherein the inclination sensor detects an inclination of the triaxial electronic compass, the method including obtaining an elevation angle of the specific direction with respect to a horizontal plane from the inclination sensor to switch a selection of two output values from the three output values to another selection of two output values therefrom in accordance with the elevation angle; determining a geomagnetic aspect from the two output values selected from among the three output values; obtaining a rotational angle about an axis extending in the specific direction from the inclination sensor; calculating an angle of a deviation of the direction of the triaxial electronic compass, oriented in the specific direction, which is caused by the selection switching, in accordance with the elevation angle, the geomagnetic aspect and the rotational angle; and correcting the direction of the triaxial electronic compass, oriented in the specific direction, in accordance with the deviation angle.

It is desirable for the selection of the two output values from the three output values to be switched to another selection of two output values therefrom upon the elevation angle exceeding a predetermined boundary value within one of a range from 30° to 60° and a range from −30° to −60°.

It is desirable for the calculating of the deviation angle to include calculating the deviation angle according to the following equation:

$$\Delta\eta = \operatorname{ArcTan}(\operatorname{Tan}(\theta)/\sin(h)) \quad \text{(EQUATION 3)},$$

wherein h designates the elevation angle, θ designates the rotational angle, and Δη designates the deviation angle.

It is desirable for the correcting of the direction of the triaxial electronic compass, oriented in the specific direction, to include calculating an actual direction in which the specific direction extends according to the following equation:

$$A' = A + \Delta\eta \quad \text{(EQUATION 4)},$$

wherein A designates a direction obtained from the triaxial electronic compass after the selection switching, and A' designates the actual direction.

In an embodiment, a direction determining apparatus is provided, which includes a triaxial electronic compass and an inclination sensor and determines a direction of the triaxial electronic compass that is oriented in a specific direction, wherein the triaxial electronic compass includes a mutually-orthogonal 3-axis geomagnetic sensor and selectively uses two output values from three output values of the mutually-orthogonal 3-axis geomagnetic sensor, and wherein the inclination sensor detects an inclination of the triaxial electronic compass, the orientation apparatus including a switcher which obtains an elevation angle of the specific direction with respect to a horizontal plane from the inclination sensor and switches a selection of two output values from among the three output values to another selection of two output values therefrom in accordance with the elevation angle; an aspect obtainer which determines and obtains an geomagnetic aspect from the two output values selected from the three output values; a rotational angle obtainer which obtains a rotational angle about an axis extending in the specific direction from the inclination sensor; a deviation angle calculator which calculates an angle of a deviation of the direction of the triaxial electronic compass, oriented in the specific direction, which is caused by the selection switching, in accordance with the elevation angle, the geomagnetic aspect and the rotational angle; and a corrector which corrects the direction of the triaxial electronic compass, oriented in the specific direction, in accordance with the deviation angle.

It is desirable for the switcher to switch the selection of the two output values from the three output values to the another selection therefrom upon the elevation angle exceeding a predetermined boundary value within one of a range from 30° to 60° and a range from −30° to −60°.

It is desirable for the deviation angle calculator to calculate the deviation angle according to the following equation:

$$\Delta\eta = \mathrm{ArcTan}(\mathrm{Tan}(\theta)/\sin(h)) \quad \text{(EQUATION 3)},$$

wherein h designates the elevation angle, θ designates the rotational angle, and Δη designates the deviation angle.

It is desirable for the corrector to calculate an actual direction of the triaxial electronic compass, oriented in the specific direction according to the following equation:

$$A' = A + \Delta\eta \quad \text{(EQUATION 4)},$$

wherein A designates a direction obtained from the triaxial electronic compass after the selection switching, and A' designates the actual direction.

It is desirable for the direction determining apparatus to be incorporated in a digital camera, and for the axis extending in the specific direction to be set parallel to a photographing optical axis of a photographing lens of the digital camera.

It is desirable for the direction determining apparatus to include an indicator which indicates a determined direction at which the photographing optical axis of the photographing lens is oriented.

According to the present invention, a direction determining method using a triaxial electronic compass is achieved which makes it possible to precisely determine the direction (orientation) of a photographic apparatus equipped with the triaxial electronic compass that is oriented in a specific direction (e.g., the direction along which a photographing optical axis of a photographing optical system incorporated in the photographic apparatus is pointing) at all times regardless of the positions (postures) of the triaxial electronic compass and the photographic apparatus that is equipped with the triaxial electronic compass. Additionally, according to the present invention, a direction determining apparatus to which this direction determining method is applied is also achieved.

The present disclosure relates to subject matter contained in Japanese Patent Application No. 2011-132364 (filed on Jun. 14, 2011) which is expressly incorporated herein by reference in its entirety.

BRIEF DESCRIPTION OF THE DRAWINGS

The present invention will be described below in detail with reference to the accompanying drawings in which:

FIG. 8 is a flow chart showing a series of operations performed to calculate the direction in which the photographing optical axis is pointing by the direction determining method and apparatus using a triaxial electronic compass.

DESCRIPTION OF THE EMBODIMENT

Figure 1:
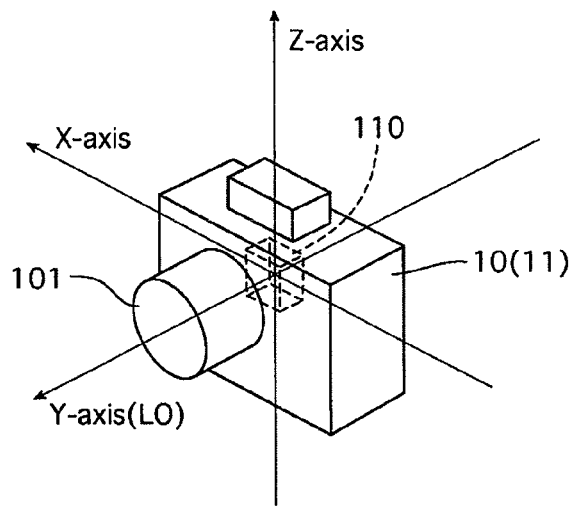
FIG. 1 is a perspective view of a camera equipped with a triaxial electronic compass, showing the relationship between the posture of the camera and the three orthogonal axes of the triaxial electronic compass.

FIG. 1 is a perspective view of a camera 10 equipped with a triaxial electronic compass 110 having three orthogonal axes (sensor axes), showing the relationship between the posture of the camera 10 and the three axes (optimum-sensitive directional axes of a 3-axis geomagnetic sensor) of the triaxial electronic compass 110. The triaxial electronic compass 110 selects two output values from three output values (e.g., voltage values) respectively detected by three geomagnetic sensors of the 3-axis geomagnetic sensor and performs computations on the selected two output values to determine the geomagnetic aspect (direction) (of geomagnetic flux lines). The three axes of the triaxial electronic compass 110 are defined as X, Y and Z axes, respectively, that are orthogonal to one another. In FIG. 1, the axis of one of the three geomagnetic sensors of the 3-axis geomagnetic sensor of the triaxial electronic compass 110 is coincident with the Y-axis that is set to be parallel to a photographing optical axis LO of a photographing lens 101 of the camera 10. The axes of the other two geomagnetic sensors are coincident with the X-axis that is set to be parallel to the bottom of the camera 10 and the Z-axis that is set to correspond to the vertical direction of the camera 10, respectively.

Geomagnetic lines of force are assumed to extend in the horizontal direction on earth. At any location, the earth's magnetic field can be represented by a vector that has both direction and magnitude (hereinafter referred to as a "geomagnetic vector"), and accordingly, a biaxial plane defined by the X-axis and the Y-axis (hereinafter referred to as "X-Y plane") of the triaxial electronic compass 110 become horizontal when the camera 10 is held horizontally on earth.

Figure 2A:
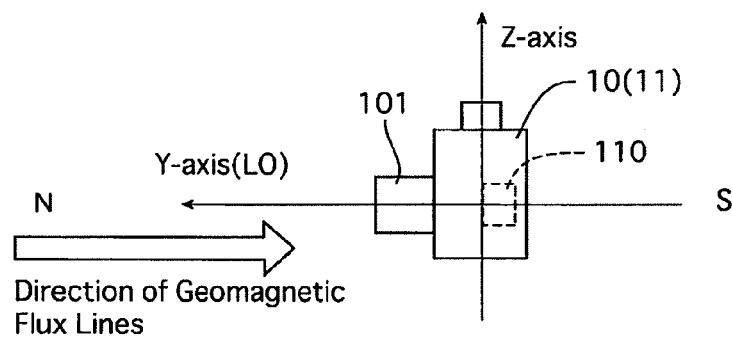
FIG. 2A is a side elevational view of the camera when the camera is held horizontally.
Figure 2B:
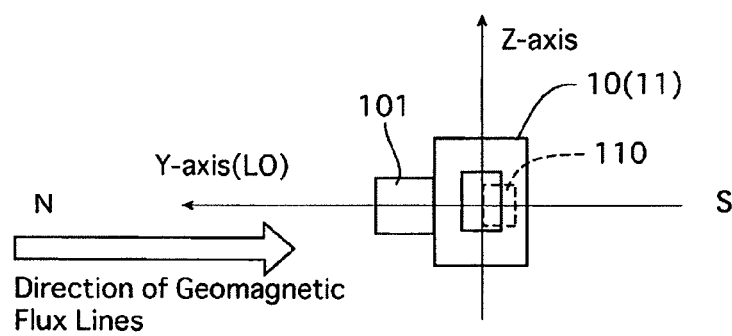
FIG. 2B is a plan view of the camera when the camera is held horizontally.
Figure 3:
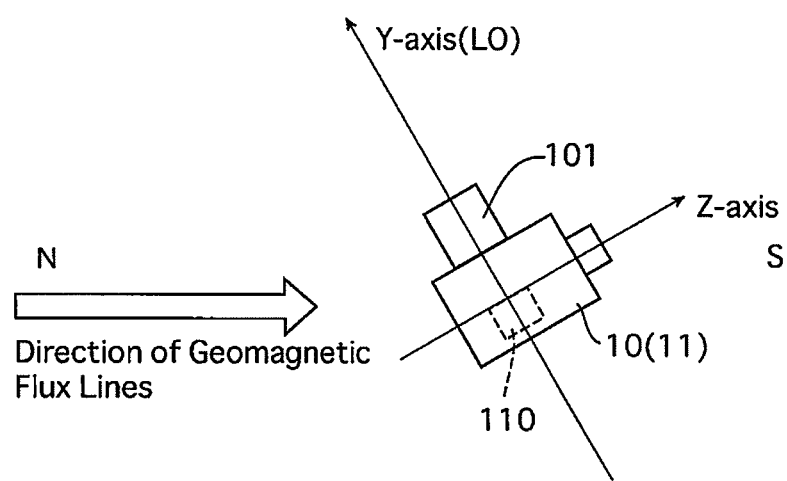
FIG. 3 is a side elevational view of the camera when the camera is pointed upward.
Figure 4A:
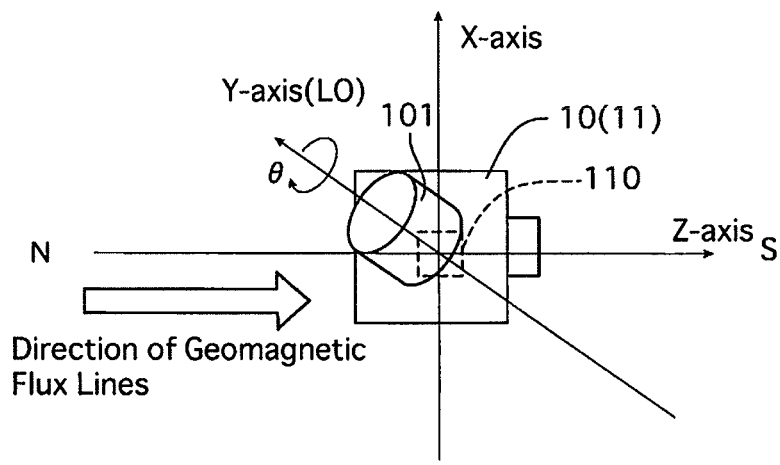
FIG. 4A is a plan view of the camera when the camera is pointed upward.
Figure 4B:
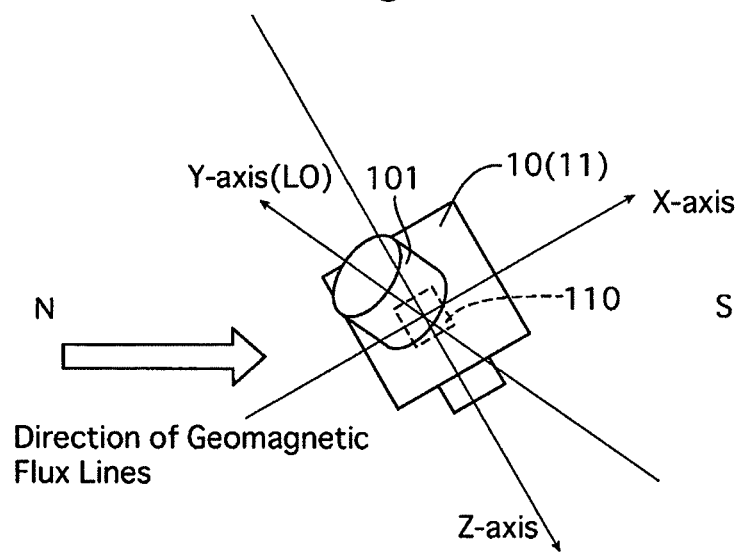
FIG. 4B is a plan view of the camera when the camera has been rotated about a photographing optical axis from the position shown in FIG. 4A.

The relationship between the geomagnetic vector, and the camera 10 and the three axes of the triaxial electronic compass 110 when the camera 10 is held horizontally on earth is as shown in FIGS. 2A and 2B. The horizontally holding state of the camera 10 denotes a state where the photographing optical axis LO is horizontal (i.e., parallel to a horizontal plane) and also the bottom of the camera 10 or the long sides of the imaging surface of the camera 10 are horizontal (i.e., parallel to a horizontal plane). When the camera 10 is held horizontally in such a holding manner, the X-Y plane is horizontal while the Z-axis is vertical. This position (posture) of the camera 10 (camera body 11; see FIG. 7) is set as a reference position. In FIGS. 2 through 4, the symbol S designates the direction toward the geomagnetic south pole (magnetic north) and the symbol N designates the direction toward the geomagnetic north pole.

Changing the orientation of the photographing lens 101 in a horizontal plane (i.e., panning the camera 10) causes the angle between the X-axis and the geomagnetic vector and the angle between the Y-axis and the geomagnetic vector to change, thus causing the outputs of the X-axis direction geomagnetic sensor and the Y-axis direction geomagnetic sensor to fluctuate, and accordingly, the direction of the geomagnetic vector (magnetic north) in the X-Y plane can be calculated by combining the outputs of the X-axis direction geomagnetic sensor and the Y-axis direction geomagnetic sensor.

Since the earth's magnetic field can be represented by a vector that has both direction and magnitude at any location on earth, the direction of the geomagnetic vector (direction toward the magnetic north (South Pole)/azimuth) can be more precisely calculated as the magnitude of the geomagnetic vector projected onto the X-Y plane is greater, i.e., as the angle (absolute value) between the X-Y plane and a horizontal plane is closer to 0 degree. On the other hand, if the camera 10 is tilted upward or downward, the angle (absolute value) between the X-Y plane and the geomagnetic line of force increases, which causes the geomagnetic vector projected onto the X-Y plane to decrease in magnitude, thus causing accuracy to deteriorate; the accuracy and precision of the triaxial electronic compass 110 deteriorate considerably when the camera 10 is tilted to a maximum angle of 90 degrees because the magnitude of the projected geomagnetic vector becomes zero at the maximum tilt angle. Accordingly, in the case where the camera 10 is tilted upward or downward beyond an angle of 45 degrees between the X-Y plane and the geomagnetic line of force, the accuracy is improved if geomagnetism is detected with use of a biaxial plane defined by the X-axis and the Z-axis (hereinafter referred to as "X-Z plane"). Accordingly, in the present embodiment, an acceleration sensor (triaxial acceleration sensor/inclination sensor) 120 (see FIG. 7) is incorporated in the camera 10 to determine an elevation angle (including elevation and dip) h between the photographing optical axis LO and a horizontal plane using the acceleration sensor 120, and a selection of two output values from among three output values output from the 3-axis geomagnetic sensor is switched to a different selection with the absolute value of 45 degrees of the elevation angle h set as a boundary for the switching control. More specifically, in the case where the geomagnetic vector is horizontal, the output values of either the X-axis direction geomagnetic sensor and the Y-axis direction geomagnetic sensor which form the X-Y plane or the X-axis direction geomagnetic sensor and the Z-axis direction geomagnetic sensor which form the X-Z plane with which the absolute value of the elevation angle h becomes smaller than 45 degrees are selected. In the following descriptions, switching the output values of a pair of geomagnetic sensors selected from among the three geomagnetic sensors of the 3-axis geomagnetic sensor to the output values of a different pair of geomagnetic sensors will be referred to as "switching the triaxial electronic compass 110 to a 2-axis geomagnetic sensor," and performing a computation using the output values of a pair of geomagnetic sensors selected from among the three geomagnetic sensors of the 3-axis geomagnetic sensor will be referred to as "determining with use of a 2-axis geomagnetic sensor." Accordingly, the 3-axis geomagnetic sensor of the triaxial electronic compass 100 can be selectively used as the following three types of 2-axis geomagnetic sensors: an X-Y axis geomagnetic sensor, an X-Z axis geomagnetic sensor and a Y-Z axis geomagnetic sensor.

However, if the 3-axis geomagnetic sensor of the triaxial electronic compass 110 is switched from one 2-axis geomagnetic sensor to another to detect geomagnetism via the 2-axis geomagnetic sensor which forms the X-Z plane, the 3-axis geomagnetic sensor of the triaxial electronic compass 110 determines the geomagnetic vector within the X-Z plane. In the case of the camera 10 shown in FIG. 1, if the 3-axis geomagnetic sensor that is used as an element of the triaxial electronic compass 110 is switched to, e.g., the 2-axis geomagnetic sensor which forms the X-Z plane, the direction at which the Z-axis extends (the direction to which the bottom and the top of the camera 10 are oriented) or the direction at which the X-axis extends (the direction to which the lateral sides of the camera 10 are oriented) can be determined.

In the case where tracking data for celestial-object auto tracking photography like that disclosed in the above-mentioned Japanese Unexamined Patent Publication Nos. 2008-289052 and 2010-122672 is calculated, highly accurate data on the direction (orientation) at which the photographing lens 101 is pointing is required. However, in a state where the elevation angle h exceeds 45 degrees, i.e., in a state where the triaxial electronic compass 110 has been switched to the 2-axis geomagnetic sensor which forms the X-Z plane, if the posture of the camera 10 is changed so as to rotate the camera 10 about the photographing optical axis LO, e.g., if the camera 10 is rotated about the photographing optical axis LO so as to change the posture of the camera 10 from the posture shown in FIGS. 3 and 4(A) to the posture shown in FIG. 4(B), the direction of the geomagnetic vector with respect to the X-Z plane changes though the direction the photographing lens 101 is pointing remains unchanged; consequently, the triaxial electronic compass 110 will erroneously determine a direction that is different from the actual direction that the photographing lens 101 is oriented.

To overcome this problem, when measured data (data on the direction of geomagnetic flux lines and the direction of the magnetic north) is obtained from the triaxial electronic compass 110 having switched to the 2-axis geomagnetic sensor which forms the X-Z plane, the elevation angle h (the angle of the photographing optical axis LO relative to a horizontal plane) and a rotational angle θ of the camera 10 about the photographing optical axis LO are obtained from the acceleration sensor (triaxial acceleration sensor) 120 (see FIG. 7), which is for determining the posture of the camera 10, to correct the measured data obtained from the triaxial electronic compass 110 into data on the actual direction the photographic optical axis LO is oriented. The acceleration sensor 120 functions as an inclination sensor for detecting the elevation angle h and the rotational angle θ about the photographing optical axis LO.

More specifically, for instance, it is assumed that the state where the camera 10 is held horizontally (i.e., the state where the photographing optical axis LO and the bottom of the camera 10 are parallel to a horizontal plane) is defined as the state where the rotational angle θ is 0 degrees and that the direction the photographing optical axis LO is pointing is currently detected as the north (N). Thereafter, when the elevation angle h is changed without the camera 10 being rotated about the photographing optical axis LO, it is assumed that the camera 10 is set (programmed) such that the direction at which the photographing optical axis LO is oriented, which is determined by the triaxial electronic compass 110, remains unchanged from "north" even if the 3-axis geomagnetic sensor of the triaxial electronic compass 110 is switched to the 2-axis geomagnetic sensor which forms the X-Z plane. With these assumptions, when the camera 10 is held vertically by rotating the camera 10 about the photographing optical axis LO by 90 degrees (so as to set the rotational angle θ at 90 degrees) from a state where the camera 10 is held horizontally, the 3-axis geomagnetic sensor of the triaxial electronic compass 110 has been already switched to a 2-axis geomagnetic sensor which forms the Y-Z plane. Accordingly, from this vertical (portrait) position, if the elevation angle h is changed without the camera 10 being rotated about the photographing optical axis LO, the direction at which the photographing optical axis LO is oriented, which is indicated by the triaxial electronic compass 110, deviates by 90 degrees (or −90 degrees) with respect to the previously detected direction ("north") at the point in time at which the 3-axis geomagnetic sensor of the triaxial electronic compass 110 is switched to the 2-axis geomagnetic sensor which forms the X-Z plane, thus resulting in the detection of "west" (or "east"). Therefore, the detected value (direction) only needs to be corrected by subtracting or adding 90 degrees from or to the detected value in the case where a vertical position of the camera 10 (θ=90) is detected. However, in the case where the rotational angle θ is at some midpoint between 0 degree and 90 degrees (0°<θ<90°, a precise direction cannot be found merely by subtracting θ degrees, which is identical in value to the rotational angle, from the value (direction) detected by the triaxial electronic compass 110.

To generalize a method of measuring a precise azimuth angle of the photographing optical axis LO in a state where the 3-axis geomagnetic sensor of the triaxial electronic compass 110 has been switched to a 2-axis geomagnetic sensor by tilting of the camera 10 at the elevation angle h, consideration needs to be given to the fact that the 2-axis geomagnetic sensor of the 3-axis geomagnetic sensor of the triaxial electronic compass 110 which forms the X-Z plane that tilts in accordance with the elevation angle h (45°<h<90°) detects geomagnetism. In other words, even if the triaxial electronic compass 110 indicates the same direction of 0 degrees when the elevation angle h is either of 45 and 90 degrees, the magnitude of the geomagnetic vector projected onto the X-Z plane varies between the case where the elevation angle h is 45 degrees and the case where the elevation angle h is 90 degrees. This variation can be explained by the state of a circle seen as an ellipse as viewed from above when this circle, which is initially held horizontally, is tilted so as to increase the elevation angle. If points obtained from the geomagnetic vector when the 3-axis geomagnetic sensor of the triaxial electronic compass 110 is made to rotate in a horizontal plane are plotted on a two-axis plane, a circle (hereinafter referred to as "magnetic circle") is delineated (see FIGS. 5 and 6).

Figure 5:
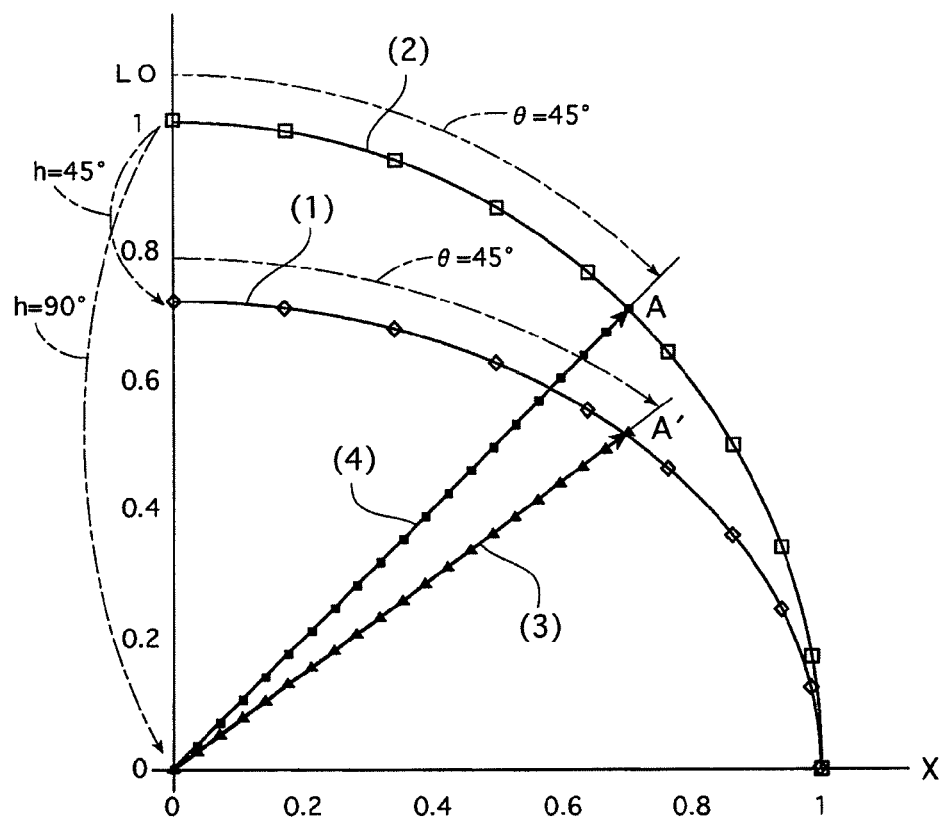
FIG. 5 is a graph showing the state of geomagnetic vectors measured by rotating the triaxial electronic compass.

This will be hereinafter described more specifically with reference to FIG. 5. If the camera 10 is tilted upward until the elevation angle h becomes 90 degrees without the camera 10 being rotated about the photographing optical axis LO) (θ=0° from an initial state of the camera 10 in which the camera 10 is held horizontally, and subsequently the camera 10 is rotated about the photographing optical axis LO with the photographing optical axis LO aimed at the zenith, the magnetic circle (the plot of the geomagnetic vector) delineated on the X-Z plane turns a circular path (since the X-Z plane is parallel to a horizontal plane), and the X-Z plane rotates through the angle of rotation of the camera 10 about the photographing optical axis LO (the rotational angle) with respect to the geomagnetic vector. The delineation of this magnetic circle as a unit circle is shown in FIG. 5 as a circular path (2), and the magnetic vector in the case where the camera 10 is rotated about the photographing optical axis LO through an angle of 45 degrees (θ=45°) is represented by a orientation line (4) that indicates the direction the Z-axis is oriented. In FIG. 5, the vertical axis represents the direction of the photographing optical axis LO (the Y-axis) when the camera 10 is in the initial state, and corresponds with the direction of the Z-axis when the photographing optical axis LO points toward the zenith. It can be seen in FIG. 5 that the orientation line (4) of the Z-axis deviates (has rotated) from the initial direction of the photographing optical axis LO at an angle of 45 degrees.

Figure 6:
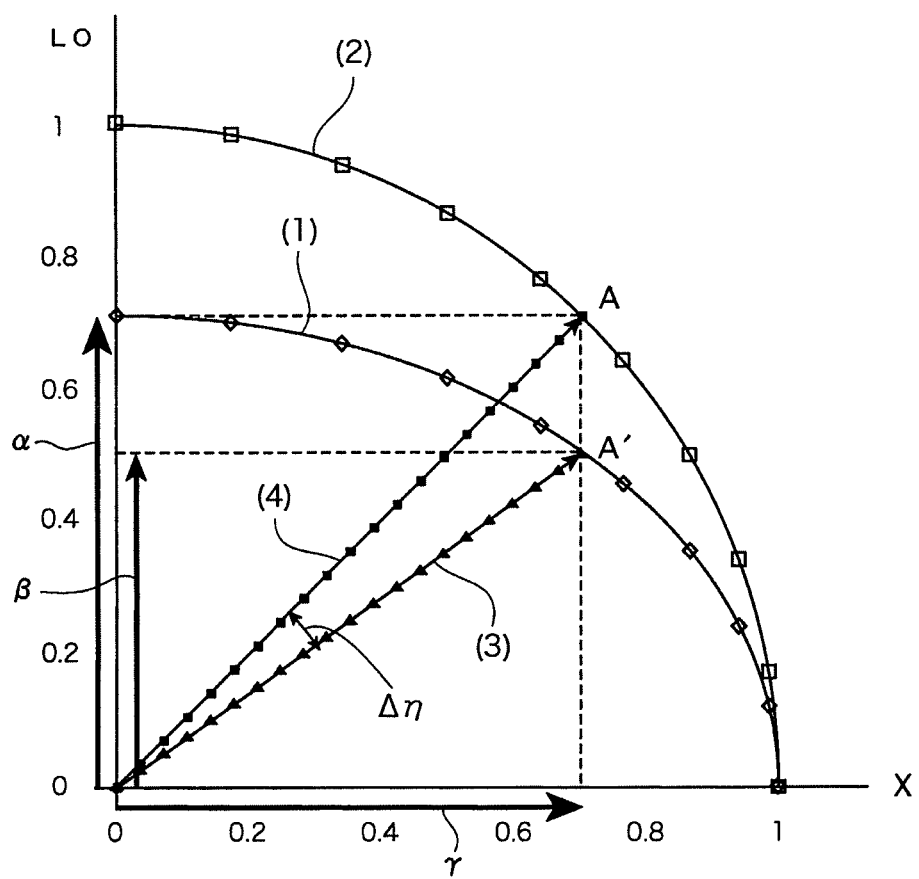
FIG. 6 is a graph showing the state of geomagnetic vectors measured by rotating the triaxial electronic compass, wherein orientation lines of the Z-axis are broken down into components in orthogonal directions.

On the other hand, from the initial state of the camera 10, if the camera 10 is tilted until the elevation angle becomes 45 degrees (i.e., if the elevation angle h of the photographing optical axis LO is made to be 45 degrees) without the camera 10 being rotated about the photographing optical axis LO, the X-Z plane is angled relative to a horizontal plane at an angle of 45 degrees, so that the magnetic circle projected onto the X-Z plane becomes an elliptical path (1). In this state, if the camera 10 is made to rotate about the photographing optical axis LO by 45 degrees, it can be seen from FIG. 5 that the Z-axis is oriented in a direction deviating even from the photographing optical axis LO and data on the orientation line (4) of the Z-axis as shown by a orientation line (3). This is due to the fact that only the diameter of the circular path (2) on the photographing optical axis LO side is reduced like the elliptical path (1), and that the circular path (2) and the elliptical path (1) are mutually identical in diameter in a direction orthogonal to the photographing optical axis LO. Namely, if the orientation line (3) of the Z-axis is resolved into orthogonal vectors β and γ and the orientation line (4) of the Z-axis is resolved into orthogonal vectors α and γ as shown in FIG. 6, the vector β of the orientation line (3) (when the elevation angle h is 45 degrees) is smaller than the vector α of the orientation line (4) (when the elevation angle h is 90 degrees) though the vector γ of the orientation line (3) and the vector γ of the orientation line (4) are mutually identical in magnitude, and accordingly, a deviation occurs between the orientation lines (3) and (4) of the Z-axis as shown in FIGS. 5 and 6 when the orthogonal vectors are combined. To overcome this problem, the present embodiment of the camera 10 corrects the deviation of the direction determined by the triaxial electronic compass 110 from the direction the photographing optical axis LO is oriented, which is caused by variations of the elevation angle h as described above, in a manner which will be discussed hereinafter.

The following equation is satisfied:

$$\Delta\eta = \text{ArcTan}(\text{magnitude of vector } \alpha/\text{magnitude of vector } \gamma) \quad \text{(EQUATION 1)},$$

wherein Δη represents the angle between the photographing optical axis LO and the orientation line (3) of the Z-axis.

The magnitude of the vector γ is expressed by cos(θ), wherein θ represents the rotational angle about the photographing optical axis LO.

Regarding the magnitude of the vector α, if a variable Y is regarded as the magnitude of the vector α in the general equation of an ellipse $$(X^2)/(a^2)+(Y^2)/(b^2)=1 \quad \text{(EQUATION 2)}$$

the following equations are obtained if "a" in this equation is assumed to be 1:

$$X=\cos(\theta), b=\sin(h),$$

wherein h represents the elevation angle.

Accordingly, the deviation angle Δη can be calculated according to the following equation:

$$\Delta\eta = \text{ArcTan}(((1-(\cos(\theta)^2/a^2)^{1/2}) \times \sin(h))/\cos(\theta)) = \text{ArcTan}(\text{Tan}(\theta)/\sin(h)) \quad \text{(EQUATION 3)}.$$

Hence, from a direction A obtained from the triaxial electronic compass 110 and the deviation angle Δη, the actual direction A' that the photographing optical axis LO is oriented, after the 3-axis geomagnetic sensor of the triaxial electronic compass 110 is switched to a 2-axis geomagnetic sensor, can be calculated according to the following equation:

$$A' = A + \Delta\eta \quad \text{(EQUATION 4)}.$$

Figure 7:
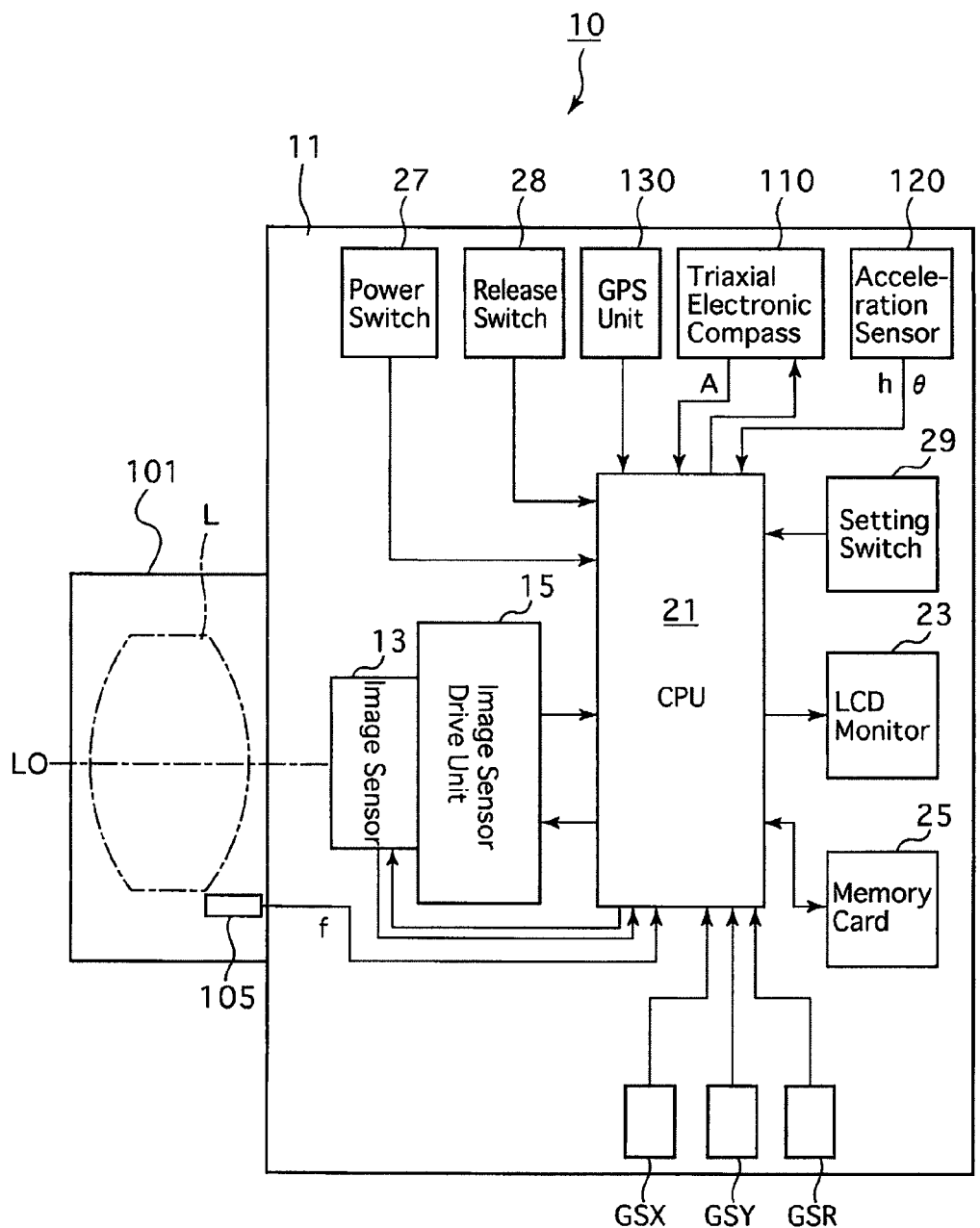
FIG. 7 is a block diagram illustrating main components of an embodiment of a digital camera to which a direction determining apparatus equipped with a triaxial electronic compass according to the present invention has been applied.

An embodiment of a digital camera in which a direction determining method using a triaxial electronic compass according to the present invention is incorporated will be hereinafter discussed with reference to FIG. 7. The present embodiment of the camera (digital camera/photographic apparatus) 10 is provided with a camera body 11 and the photographing lens 101 (that contains a photographing optical system L). The camera 10 is provided, in the camera body 11 behind the photographing optical system L, with an image sensor 13 serving as an image pickup device. The photographing optical axis LO of the photographing optical system L and an imaging surface (photosensitive surface/imaging plane) 14 of the image sensor 13 are orthogonal to each other. The image sensor 13 is mounted onto an image sensor drive unit (image sensor mover/anti-shake unit) 15. The image sensor drive unit 15 is provided with a fixed stage, a movable stage which is movable relative to the fixed stage, and an electromagnetic circuit for moving the movable stage relative to the fixed stage. The image sensor 13 is held by the movable stage. The image sensor 13 (the movable stage) is controlled and driven to linearly move in desired directions parallel to a plane orthogonal to the photographing optical axis LO at a desired moving speed and to rotate about an axis parallel to the photographing optical axis LO (about an instantaneous center at some point in a plane orthogonal to the photographing optical axis LO) at a desired rotational speed. This type of image sensor drive unit 15 is known in the art as an anti-shake unit of an image shake corrector (shake reduction system/image stabilizer).

The camera 10 is provided in the camera body 11 with a CPU (switcher/direction obtainer/rotational angle obtainer/deviation angle calculator/corrector/calculation controller) 21 which controls the overall operation of the camera 10. The CPU 21 drives the image sensor 13 and controls the operation thereof, and performs a signal processing operation on an image signal of an object image captured by the image sensor 13 to display this image on an LCD monitor 23, and writes image data of this image onto a removable memory card 25. To detect vibrations applied to the camera 10 when the image sensor drive unit 15 is used as an anti-shake unit, the CPU 21 inputs signals detected by an X-direction gyro sensor GSX, a Y-direction gyro sensor GSY and a rotational gyro sensor GSR.

The camera body 11 is provided with various switches such as a power switch 27, a release switch 28 and a setting switch 29. The CPU 21 performs controls according to the ON/OFF states of these switches 27, 28 and 29. For instance, the CPU 21 turns ON/OFF the power supply from a battery (not shown) upon receipt of an operation signal from the power switch 27, and performs a focusing process, a photometering process and an image capturing process upon receipt of an operation signal from the release switch 28. The setting switch 29 is for selectively setting various photography modes (exposure modes).

The camera 10 is provided in the camera body 11 with a GPS unit 130 serving as a latitude information inputter, the triaxial electronic compass 110 serving as an azimuth information inputter, and an acceleration sensor (triaxial acceleration sensor) 120 serving as an elevation angle and inclination information inputter. Latitude and longitude information is input to the CPU 21 from the GPS unit 130, information on the direction A is input to the CPU 21 from the triaxial electronic compass 110, and information on the rotational angle θ about the photographing optical axis LO (lateral inclination angle of the camera body 11) and the elevation angle h is input to the CPU 21 from the acceleration sensor 120.

Information on the camera posture includes information on the rotational angle θ about the photographing optical axis LO from the aforementioned reference position of the camera body 11 (the image sensor 13) and information on the elevation angle h of the photographing lens 101 (the photographing optical axis LO). The reference position of the camera body 11 (the image sensor 13) is, e.g., the position where the X-Y plane is a horizontal plane provided that a direction parallel to the photographing optical axis LO and a direction parallel to the long sides of the rectangular image sensor 13 (normally the direction parallel to the bottom of the camera body 11) are defined as a Y-axis direction (Y-direction) and an X-axis direction (X-direction), respectively. In addition, the rotational angle θ denotes the angle of rotation of the camera body 11 when rotating from the reference position about the photographing optical axis LO, while the elevation angle h denotes the angle between the photographing optical axis LO (the Y-axis) and a horizontal plane when the camera body 11 is oriented upward or downward. When the camera body 11 is in the initial position, both the rotational angle (lateral inclination angle) θ and the elevation angle h are zero (0) degrees.

The triaxial electronic compass 110 is set so that the Y-axis extends parallel to the photographing optical axis LO, so that the X-axis extends parallel to the lengthwise direction of the image sensor 13 of the camera body 11 and so that the Z-axis extends in a direction orthogonal to both the X-axis and the Y-axis (i.e., extends parallel to the short sides of the image sensor 13). In addition, the CPU 21 determines (calculates) the direction the photographing optical axis LO is oriented (photographing direction) using the triaxial electronic compass 110 regardless of the posture of the camera body 11.

The GPS unit 130, the triaxial electronic compass 110 and the acceleration sensor 120 can be in-built into the camera body 11, or at least one of the GPS unit 130, the triaxial electronic compass 110 and the acceleration sensor 120 or all of them can be externally provided with respect to the camera body 11. Specifically, it is possible for these sensing devices 110, 120 and 130 to be installed to an accessory shoe or a bracket mounted to the underside of the camera body 11 so that outputs of the sensing devices 110, 120 and 130 are input to the CPU 21 via electrical contacts of the accessory shoe or a connector such as a USB connector.

The CPU 21 displays latitude and longitude information that is input from the GPS unit 130, information on the direction A that is input from the triaxial electronic compass 110, information on the elevation angle h and the rotational angle (camera posture) θ that are input from the acceleration sensor 120 and the focal length information f that is input from a focal length detector 105 on the LCD monitor 23, and writes this information into the memory card 25 as photographic information or log information.

Operations for determining the direction the photographing optical axis LO is pointing which are performed by the camera 10 will be hereinafter discussed with reference to the flow chart shown in FIG. 8. In this flow chart, first the CPU 21 obtains the elevation angle h from the acceleration sensor 120 (step S11). Subsequently, the CPU 21 determines whether or not the elevation angle h obtained at step S11 is greater than +45 degrees or smaller than −45 degrees (step S13). The CPU 21 obtains the direction A from the triaxial electronic compass 100 (step S15) and control ends if determining that the elevation angle h obtained at step S11 is not greater than +45 degrees and not smaller than −45 degrees (−45°≤h≤45°; NO at step S13). In this case, the direction A input from the triaxial electronic compass 110 is coincident with the photographing direction of the photographing optical axis LO since the triaxial electronic compass 110 uses the 2-axis geomagnetic sensor which forms the X-Y plane.

If the CPU 21 determines that the elevation angle h obtained at step S11 is greater than +45 degrees (45°<h≤90°) or smaller than −45 degrees (−90°≤h<−45°) (if YES at step S13), the CPU 21 sends a switching signal to the triaxial electronic compass 110 for switching the triaxial electronic compass 110 to the 2-axis geomagnetic sensor which forms the X-Z plane. Upon receipt of this switching signal, the triaxial electronic compass 110 switches the 3-axis geomagnetic sensor thereof to the 2-axis geomagnetic sensor which forms the X-Z plane (step S17) to determine geomagnetism via this 2-axis geomagnetic sensor and output the direction A. The CPU 21 obtains this direction A from the triaxial electronic compass 110 (step S19). Subsequently, the CPU 21 obtains the rotational angle θ from the acceleration sensor 120 (step S21). The order in which the step (S19) of obtaining the direction A from the triaxial electronic compass 110 and the step (S21) of obtaining the rotational angle θ from the acceleration sensor 120 are performed does not have to be a particular order. Namely, the CPU 21 can obtain the direction A from the triaxial electronic compass 110 after obtaining the rotational angle θ from the acceleration sensor 120.

Subsequently, the CPU 21 determines whether or not the elevation angle h is +90 or −90 degrees (step S22). If the CPU 21 determines that the elevation angle h is +90 or −90 degrees (if YES at step S22), it is assumed that the photographing optical axis LO is pointed vertically upward or downward, and therefore, the direction at which the photographing optical axis LO is oriented cannot be determined. Additionally, the rotational angle θ cannot be obtained either. Accordingly, the direction A remains as it is, i.e., as that obtained at step S19, and 0 degrees is assigned to θ (i.e., θ=0) (step S24). At this time, an indication "vertical" can be displayed on the LCD monitor 23. If the CPU 21 determines that the elevation angle h is neither +90 nor −90 degrees (45°<h<90° or −90°<h≤−45°; if NO at step S22), the CPU 21 assigns the elevation angle h and the rotational angle θ respectively obtained at steps S11 and S21 to EQUATION 3 mentioned above to calculate the deviation angle Δη (step S23). In addition, the CPU 21 assigns the direction A obtained at step S19 and the deviation angle Δη calculated at step S23 to EQUATION 4 mentioned above to calculate the direction A' that corresponds to the photographing direction of the photographing optical axis LO (step S25).

With the above described process (series of operations), the CPU 21 can calculate the direction A', which corresponds to the precise photographing direction of the photographing optical axis LO, even if the camera body 11 faces toward the zenith, etc. The calculated direction A' is indicated on the LCD monitor 23 and written into the memory card 25 as photographic data.

Since the camera 10, which incorporates a direction determining apparatus using a triaxial electronic compass according to the present invention, also incorporates the GPS unit 130, a photographing azimuth and a photographing elevation angle can also be recorded together with positional information on photographing location (latitude and longitude information). Additionally, utilizing various pieces of information obtained by the above described process in the celestial-object auto tracking photography such as disclosed in Patent Literatures 4 and 5 makes it possible to precisely determine the photographing direction at which the photographing lens (photographing optical system) 101 of the camera (photographic apparatus) 10 is oriented regardless of the elevation angle of the camera body 11, thus making it possible to calculate tracking data for celestial-object auto tracking photography with precision.

In the above described embodiment, the 3-axis geomagnetic sensor of the triaxial electronic compass 110 is switched from the 2-axis geomagnetic sensor which forms the X-Y plane to the 2-axis geomagnetic sensor which forms the X-Z plane upon the obtained photographing elevation angle h becoming greater than +45 degrees or smaller than −45 degrees. However, the boundary value at which the 3-axis geomagnetic sensor of the triaxial electronic compass 110 is switched from one 2-axis geomagnetic sensor to another is not limited to +45 degrees or −45 degrees; for instance, the boundary value can be set at an angle within the range of 30 to 60 degrees or the range of −30 to −60 degrees as appropriate.

Although the camera 10, to which direction determining method and apparatus using a triaxial electronic compass according to the present invention have been applied, has been described above as an embodiment of the present invention, the present invention is applicable to not only cameras but also different apparatuses such as an astronomical telescope, a telescope, a pair of binoculars, a cellular phone, etc.

Obvious changes may be made in the specific embodiment of the present invention described herein, such modifications being within the spirit and scope of the invention claimed. It is indicated that all matter contained herein is illustrative and does not limit the scope of the present invention.

What is claimed is:

1. A method of determining a direction of a triaxial electronic compass that is oriented in a specific direction by using said triaxial electronic compass and an inclination sensor, wherein said triaxial electronic compass includes a mutually-orthogonal 3-axis geomagnetic sensor and selectively uses two output values from among three output values of said mutually-orthogonal 3-axis geomagnetic sensor, and wherein said inclination sensor detects an inclination of said triaxial electronic compass, said method comprising:

obtaining an elevation angle of said specific direction with respect to a horizontal plane from said inclination sensor to switch a selection of two output values from said three output values to another selection of two output values therefrom in accordance with said elevation angle;

determining a geomagnetic aspect from said two output values selected from among said three output values;

obtaining a rotational angle about an axis extending in said specific direction from said inclination sensor;

calculating an angle of a deviation of said direction of said triaxial electronic compass, oriented in said specific direction, which is caused by said selection switching, in accordance with said elevation angle, said geomagnetic aspect and said rotational angle; and correcting said direction of said triaxial electronic compass, oriented in said specific direction, in accordance with said deviation angle.

2. The method according to claim 1, wherein said selection of said two output values from said three output values is switched to said another selection of two output values therefrom upon said elevation angle exceeding a predetermined boundary value within one of a range from 30° to 60° and a range from −30° to −60°.

3. The method according to claim 1, wherein said calculating of said deviation angle comprises calculating said deviation angle according to the following equation:

$$\Delta\eta = \text{ArcTan}(\text{Tan}(\theta)/\sin(h)) \quad \text{(EQUATION 3), wherein}$$

h designates said elevation angle,
θ designates said rotational angle, and
Δη designates said deviation angle.

4. The method according to claim 3, wherein said correcting of said direction of said triaxial electronic compass, oriented in said specific direction, comprises calculating an actual direction in which said specific direction extends according to the following equation:

$$A' = A + \Delta\eta \quad \text{(EQUATION 4), wherein}$$

A designates a direction obtained from said triaxial electronic compass after said selection switching, and
A' designates said actual direction.

5. A direction determining apparatus which includes a triaxial electronic compass and an inclination sensor and determines a direction of said triaxial electronic compass that is oriented in a specific direction, wherein said triaxial electronic compass includes a mutually-orthogonal 3-axis geomagnetic sensor and selectively uses two output values from three output values of said mutually-orthogonal 3-axis geomagnetic sensor, and wherein said inclination sensor detects an inclination of said triaxial electronic compass, said orientation apparatus comprising:

a switcher which obtains an elevation angle of said specific direction with respect to a horizontal plane from said inclination sensor and switches a selection of two output values from among said three output values to another selection of two output values therefrom in accordance with said elevation angle;

an aspect obtainer which determines and obtains an geomagnetic aspect from said two output values selected from said three output values;

a rotational angle obtainer which obtains a rotational angle about an axis extending in said specific direction from said inclination sensor;

a deviation angle calculator which calculates an angle of a deviation of said direction of said triaxial electronic compass, oriented in said specific direction, which is caused by said selection switching, in accordance with said elevation angle, said geomagnetic aspect and said rotational angle; and a corrector which corrects said direction of said triaxial electronic compass, oriented in said specific direction, in accordance with said deviation angle.

6. The direction determining apparatus according to claim 5, wherein said switcher switches said selection of said two output values from said three output values to said another selection therefrom upon said elevation angle exceeding a predetermined boundary value within one of a range from 30° to 60° and a range from −30° to −60°.

7. The direction determining apparatus according to claim 5, wherein said deviation angle calculator calculates said deviation angle according to the following equation:

$$\Delta\eta = \text{ArcTan}(\text{Tan}(\theta)/\sin(h)) \quad \text{(EQUATION 3), wherein}$$

h designates said elevation angle,
θ designates said rotational angle, and
Δη designates said deviation angle.

8. The direction determining apparatus according to claim 7, wherein said corrector calculates an actual direction of said triaxial electronic compass, oriented in said specific direction according to the following equation:

$$A' = A + \Delta\eta \quad \text{(EQUATION 4), wherein}$$

A designates a direction obtained from said triaxial electronic compass after said selection switching, and
A' designates said actual direction.

9. The direction determining apparatus according to claim 5, wherein said direction determining apparatus is incorporated in a digital camera, and
wherein said axis extending in said specific direction is set to be parallel to a photographing optical axis of a photographing lens of said digital camera.

10. The direction determining apparatus according to claim 9, wherein said direction determining apparatus comprises an indicator which indicates a determined direction at which said photographing optical axis of said photographing lens is oriented.

* * * * *